United States Patent
Yoshikawa

(10) Patent No.: US 7,648,850 B2
(45) Date of Patent: Jan. 19, 2010

(54) METHOD FOR PRODUCING SEMICONDUCTOR CHIP

(75) Inventor: Toshiyuki Yoshikawa, Tokyo (JP)

(73) Assignee: Disco Corporation, Tokyo (JP)

( * ) Notice: Subject to any disclaimer, the term of this patent is extended or adjusted under 35 U.S.C. 154(b) by 327 days.

(21) Appl. No.: 11/705,525

(22) Filed: Feb. 13, 2007

(65) Prior Publication Data
US 2007/0190749 A1    Aug. 16, 2007

(30) Foreign Application Priority Data
Feb. 14, 2006    (JP) .............................. 2006-036918

(51) Int. Cl.
H01L 21/00    (2006.01)
H01L 21/46    (2006.01)

(52) U.S. Cl. ........................ 438/33; 438/68; 438/113; 438/114; 438/458; 438/460

(58) Field of Classification Search ................... None
See application file for complete search history.

(56) References Cited

U.S. PATENT DOCUMENTS

| | | | | |
|---|---|---|---|---|
| 5,185,292 | A * | 2/1993 | VanVonno et al. | 438/59 |
| 6,399,464 | B1 * | 6/2002 | Muntifering et al. | 438/465 |
| 6,461,938 | B2 * | 10/2002 | Nakabayashi | 438/458 |
| 7,329,564 | B2 * | 2/2008 | Nakamura et al. | 438/113 |
| 2001/0018229 | A1 * | 8/2001 | Kato et al. | 438/106 |
| 2002/0072202 | A1 * | 6/2002 | Odashima et al. | 438/460 |
| 2002/0192927 | A1 * | 12/2002 | Yamada | 438/460 |
| 2006/0046436 | A1 * | 3/2006 | Ohuchi et al. | 438/460 |
| 2007/0155131 | A1 * | 7/2007 | Contes | 438/458 |

FOREIGN PATENT DOCUMENTS

| JP | 401136350 | * 5/1989 |
|---|---|---|
| JP | 2002-118081 | 4/2002 |

* cited by examiner

*Primary Examiner*—Matthew C Landau
*Assistant Examiner*—James M Mitchell
(74) *Attorney, Agent, or Firm*—Smith, Gambrell & Russell, LLP

(57) ABSTRACT

A method for producing many semiconductor chips, each having a semiconductor circuit disposed on the face thereof and a die bonding film stuck to the back thereof, from a semiconductor wafer in which many rectangular regions are defined on its face by streets arranged in a lattice pattern, and the semiconductor circuit is disposed in each of the rectangular regions. The method comprises: a groove formation step of forming grooves of a predetermined depth along the streets on the face of the semiconductor wafer; a protective film sticking step of sticking a protective film to the face of the semiconductor wafer, where the grooves have been formed; a division step of grinding the back of the semiconductor wafer to render the thickness of the semiconductor wafer equal to or smaller than the depth of the groove, thereby dividing the rectangular regions individually; a die bonding film/holding film sticking step of sticking a die bonding film and a holding film, in this order, to the ground back of the semiconductor wafer; a protective film peeling step of peeling the protective film from the face of the semiconductor wafer; a spacing increasing step of stretching the holding film to increase spacing between the individually divided rectangular regions; and a die bonding film cutting step of irradiating the die bonding film with a laser beam from the face side of the semiconductor wafer through the clearance between the rectangular regions to cut the die bonding film along the clearance between the rectangular regions.

2 Claims, 4 Drawing Sheets

METHOD FOR PRODUCING
SEMICONDUCTOR CHIP

FIELD OF THE INVENTION

This invention relates to a method for producing many semiconductor chips, each of which has a semiconductor circuit disposed on the face thereof and a die bonding film stuck to the back thereof, from a semiconductor wafer in which many rectangular regions are defined on the face thereof by streets arranged in a lattice pattern, and the semiconductor circuit is disposed in each of the rectangular regions.

DESCRIPTION OF THE PRIOR ART

As is well known among people skilled in the art, it is common practice in the manufacture of a semiconductor device to produce a semiconductor chip, which has a semiconductor circuit disposed on the face thereof and a die bonding film stuck to the back thereof, and adhere such a semiconductor chip onto a lead frame or a package by the die bonding film stuck to the back of the semiconductor chip.

Japanese Unexamined Patent Publication No. 2002-118081 discloses a method for producing a semiconductor chip, which has a semiconductor circuit disposed on the face thereof and a die bonding film stuck to the back thereof, from a semiconductor wafer in which many rectangular regions are defined on the face thereof by streets arranged in a lattice pattern, and the semiconductor circuit is disposed in each of the rectangular regions. This method includes a groove formation step of cutting the face of a semiconductor wafer along streets to form grooves of a predetermined depth along the streets; a protective film sticking step of sticking a protective film to the face of the semiconductor wafer, where the grooves have been formed, after the groove formation step; a division step of grinding the back of the semiconductor wafer after the protective film sticking step to render the thickness of the semiconductor wafer equal to or smaller than the depth of the groove, thereby dividing the rectangular regions individually; a die bonding film/holding film sticking step of sticking a die bonding film and a holding film, in this order, to the ground back of the semiconductor wafer after the division step; a protective film peeling step of peeling the protective film from the face of the semiconductor wafer after the die bonding film/holding film sticking step; a die bonding film cutting step of irradiating the die bonding film with a laser beam from the face side of the semiconductor wafer through a clearance between the rectangular regions after the protective film peeling step to cut the die bonding film along the clearance between the rectangular regions; and a pickup step of picking up each of the rectangular regions, each of which has the semiconductor circuit formed on the face thereof and the die bonding film stuck to the back thereof, from the holding film after the die bonding film cutting step.

The groove formation step in the above-described method is performed by a very thin (for example, a thickness of the order of 20 μm) rotary cutting blade, and the width of each groove formed is very small. In the die bonding film cutting step in the above method, therefore, the irradiation of the die bonding film with the laser beam through the clearance between the rectangular regions, the clearance corresponding to the width of the groove, is extremely difficult, although not impossible. Thus, even the surface of the rectangular region tends to be irradiated with the laser beam, thereby damaging the semiconductor circuit disposed there. To solve such a problem, there may be a case where the grooves are formed with the use of a thick rotary cutting blade to increase the width of the groove. In this case, however, the width of the street has to be large, with the result that the number of semiconductor chips producible from a single semiconductor wafer is decreased.

SUMMARY OF THE INVENTION

It is a principal object of the present invention, therefore, to provide a novel and improved method for producing a semiconductor chip, the method being capable of sufficiently easily irradiating a die bonding film with a laser beam through a clearance between rectangular regions, while fully reliably avoiding laser beam irradiation of even the surface of the rectangular region, without decreasing the number of the semiconductor chips produced from a single semiconductor wafer.

According to the present invention, the above principal object is attained by stretching a holding film after a protective film peeling step, but before a die bonding film cutting step, thereby increasing the spacing between the individually divided rectangular regions.

That is, according to the present invention, there is provided, as a method for producing a semiconductor chip intended for attaining the above principal object, a method for producing a semiconductor chip, adapted to produce many semiconductor chips, each of which has a semiconductor circuit disposed on the face thereof and a die bonding film stuck to the back thereof, from a semiconductor wafer in which many rectangular regions are defined on the face thereof by streets arranged in a lattice pattern, and the semiconductor circuit is disposed in each of the rectangular regions, the method comprising:

a groove formation step of cutting the face of the semiconductor wafer along the streets to form grooves of a predetermined depth along the streets;

a protective film sticking step of sticking a protective film to the face of the semiconductor wafer, where the grooves have been formed, after the groove formation step;

a division step of grinding the back of the semiconductor wafer after the protective film sticking step to render the thickness of the semiconductor wafer equal to or smaller than the depth of the groove, thereby dividing the rectangular regions individually;

a die bonding film/holding film sticking step of sticking a die bonding film and a holding film, in this order, to the ground back of the semiconductor wafer after the division step, the holding film larger than the semiconductor wafer being used so that the holding film stuck extends out beyond the peripheral edge of the semiconductor film;

a protective film peeling step of peeling the protective film from the face of the semiconductor wafer after the die bonding film/holding film sticking step;

a spacing increasing step of stretching the holding film after the protective film peeling step to increase spacing between the individually divided rectangular regions;

a die bonding film cutting step of irradiating the die bonding film with a laser beam from the face side of the semiconductor wafer through the clearance between the rectangular regions after the spacing increasing step to cut the die bonding film along the clearance between the rectangular regions; and a pickup step of picking up each of the rectangular regions, each of which has the semiconductor circuit formed on the face thereof and the die bonding film stuck to the back thereof, from the holding film after the die bonding film cutting step.

Preferably, a ring frame having a larger inner diameter than the outer diameter of the semiconductor wafer is secured to a peripheral edge portion of one surface of the holding film and, in the spacing increasing step, the ring frame is relatively moved with respect to the semiconductor wafer. In the die bonding film/holding film sticking step, it is preferred that there is used an assembly having the ring frame secured to the peripheral edge portion of the one surface of the holding film and having the die bonding film stuck to a central portion of the one surface or the other surface of the holding film, and an exposed surface of the die bonding film of the assembly is stuck to the back of the semiconductor wafer.

DETAILED DESCRIPTION OF THE PREFERRED EMBODIMENTS

Figure 1:
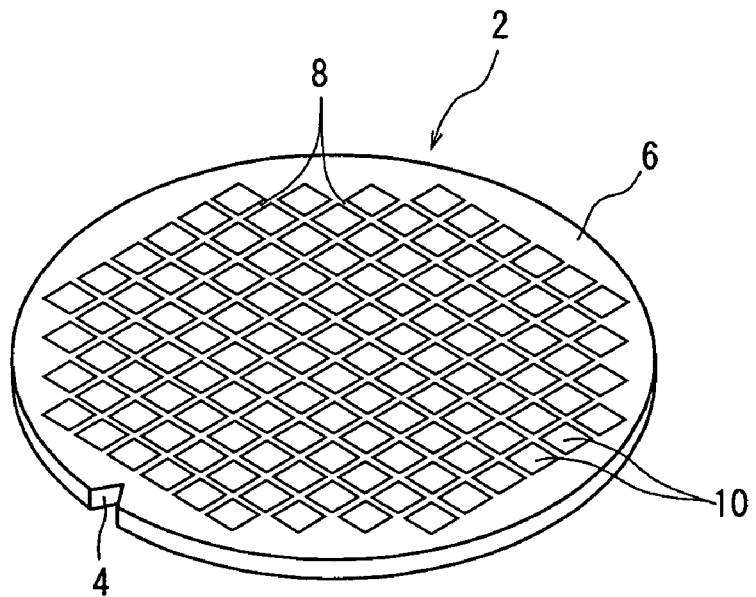
FIG. 1 is a perspective view showing a typical example of a semiconductor wafer used in the method for producing a semiconductor chip according to the present invention.

FIG. 1 shows a typical example of a semiconductor wafer used in the method for producing a semiconductor chip according to the present invention. A notch 4 showing crystal orientation is formed at the peripheral edge of a disk-shaped semiconductor wafer 2 which may be formed from silicon. Many rectangular regions 10 are defined on the face 6 of the wafer 2 by streets 8 arranged in a lattice pattern. A required semiconductor circuit (not shown) is disposed in each of the rectangular regions 10.

Figure 2:
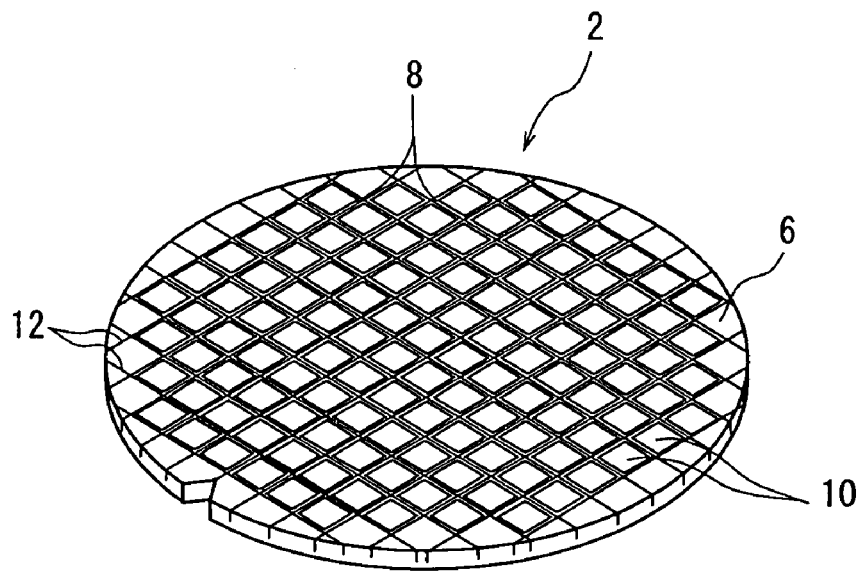
FIG. 2 is a perspective view showing a state in which grooves are formed along streets on the face of the wafer in FIG. 1.

In the method of the present invention, the first step performed is a groove formation step. In the groove formation step, as shown in FIG. 2, grooves 12 of a required depth are formed along the respective streets 8 on the face 6 of the wafer 2. Such grooves 12 can be formed advantageously by moving a rotary cutting blade (not shown) relative to the wafer 2 along the streets 8 while rotating the cutting blade at a high speed. The cutting blade can be formed by binding diamond abrasive grains by a suitable binder. The cutting blade is very thin, and its thickness is, for example, of the order of 20 μm, so that the width of the groove 12 formed is very small. The groove formation step, in which the grooves 12 are formed using the rotary cutting blade, is itself well known among persons skilled in the art, and thus its detailed explanation is omitted.

Figure 3:
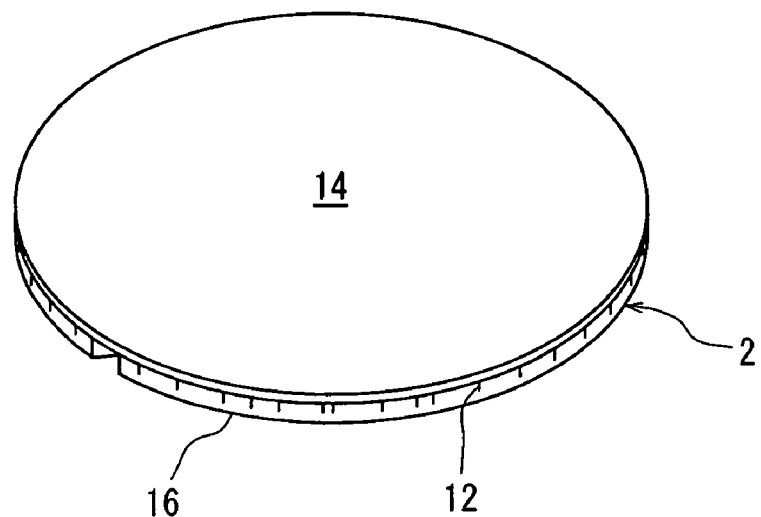
FIG. 3 is a perspective view showing a state in which a protective film is stuck to the face of the wafer in FIG. 2.

Subsequently to the above groove formation step, a protective film sticking step is performed. In this protective film sticking step, as shown in FIG. 3, a protective film 14 is stuck to the face 6 of the wafer 2 having the grooves 12 formed therein. As the protective film 14, there can be used a film formed from a suitable resin, such as polyvinyl chloride or polyolefin, which can be stuck, when heated, to the face of the wafer 2, and whose sticking force can be decreased when irradiated with ultraviolet radiation.

Figure 4:
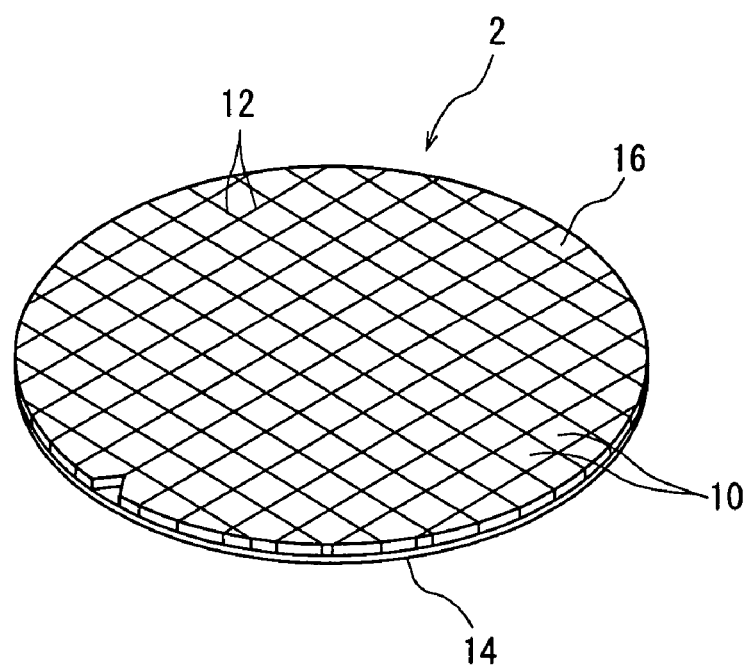
FIG. 4 is a perspective view showing a state in which the back of the wafer in FIG. 3 is ground to divide rectangular regions individually.

After the protective film sticking step, a division step is performed. In this division step, as shown in FIG. 4, the back 16 of the wafer 2 is ground, whereby the thickness of the wafer 2 is rendered equal to or smaller than the depth of the groove 12. As a result, the wafer 2 is divided into the individual rectangular regions 10 by the grooves 12 formed along the streets 8. Grinding of the back 16 of the wafer 2 can be advantageously carried out by attaching the wafer 2 firmly onto a suitable chuck means (not shown), with the wafer 2 being turned upside down, namely, with the face 6 having the protective film 14 stuck thereto being pointed downward; and allowing a grinding tool (not shown) rotated at a high speed to act on the exposed back 16 of the wafer 2 while rotating the chuck means. Since such grinding is itself well known among persons skilled in the art, its detailed explanation is omitted. In this division step, the rectangular regions 10 of the wafer 2 are individually divided. However, each of the individually divided rectangular regions 10 is stuck to the protective film 14, and thus the wafer 2 continues to be maintained integrally.

Figure 5:
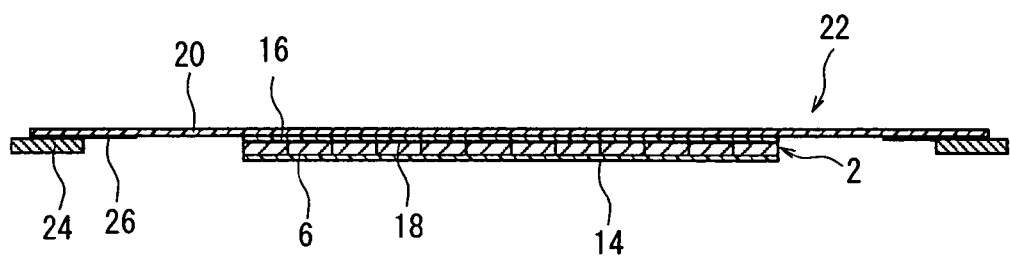
FIG. 5 is a sectional view showing a state in which an assembly including a die bonding film, a holding film, and a ring frame is stuck to the back of the wafer in FIG. 4.

Subsequently to the above division step, a die bonding film/holding film sticking step is performed. In the die bonding film/holding film sticking step, as shown in FIG. 5, a die bonding film 18 and a holding film 20 are stuck, in this order, to the ground back 16 of the wafer 2. In a preferred embodiment, an assembly 22 formed integrally beforehand is used. This assembly 22 includes the die bonding film 18 of a circular shape having substantially the same dimensions as those of the wafer 2, the holding film 20 larger than the wafer 2, and a ring frame 24 having an inner diameter larger than the outer diameter of the wafer 2. The die bonding film 18 is stuck to a central portion of one surface (lower surface in FIG. 5) of the holding film 20. A peripheral edge portion of the one surface of the holding film 20 is coated with an adhesive 26, and the ring frame 24 is secured to the peripheral edge portion of the one surface of the holding film 20 via the adhesive 26. If desired, the ring frame 24 can be secured to a peripheral edge portion of the other surface of the holding film 20 via the adhesive 26. The die bonding film 18 may be a suitable resin film whose adhesive force is increased by heating, for example, a resin film consisting essentially of a thermosetting resin such as polyimide and/or epoxy resin. The holding film 20 may be the same as the above-mentioned protective film 14. The ring frame 24 can be formed from a rigid material such as stainless steel. A preferred example of the assembly 22 is an assembly sold by LINTEC Corp. under the trade name "LE5000". It is important that adhesion between the back 16 of the wafer 2 and the die bonding film 18 and adhesion between the die bonding film 18 and the holding film 20 be greater than adhesion between the face 6 of the wafer 2 and the protective film 14. To fulfill these conditions, the die bonding film 18 can be heated to a suitable temperature, for example, of the order of 60° C., if necessary, in the die bonding film/holding film sticking step.

In the illustrated embodiment, the assembly 22 including the die bonding film 18, the holding film 20, and the ring frame 24 is used, accordingly, sticking of the die bonding film 18 and sticking of the holding film 20 are performed simultaneously. If desired, however, the die bonding film 18 can be stuck alone to the back 16 of the wafer 2, and then the holding film 20 having the ring frame 24 secured thereto can be stuck to the die bonding film 18.

Figure 6:
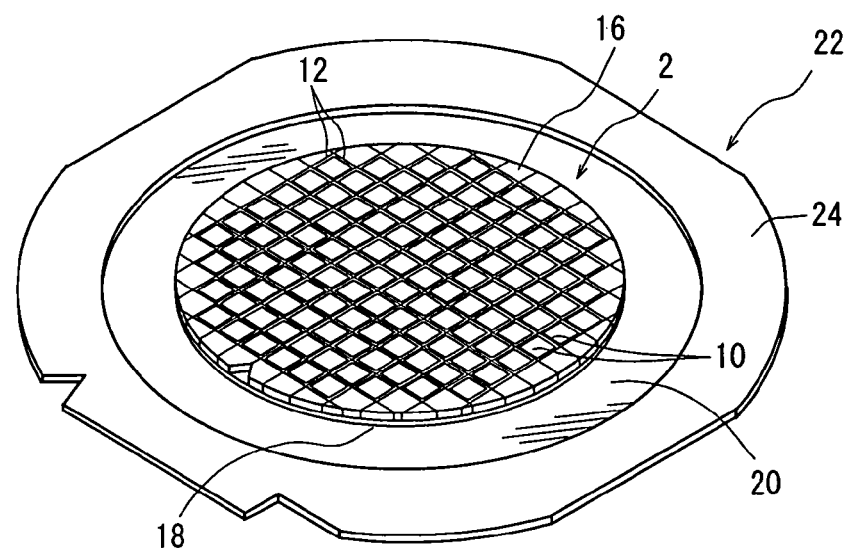
FIG. 6 is a perspective view showing a state in which the protective film has been peeled from the face of the wafer in FIG. 5.

After the die bonding film/holding film sticking step, a protective film peeling step is performed. In the protective film peeling step, as shown in FIG. 6, the protective film 14 (FIG. 3) is peeled from the face 6 of the wafer 2. On this occasion, the protective film 14 can be irradiated with ultraviolet radiation, if necessary, in order to decrease the adhesion between the protective film 14 and the face 6 of the wafer 2.

Figure 7:
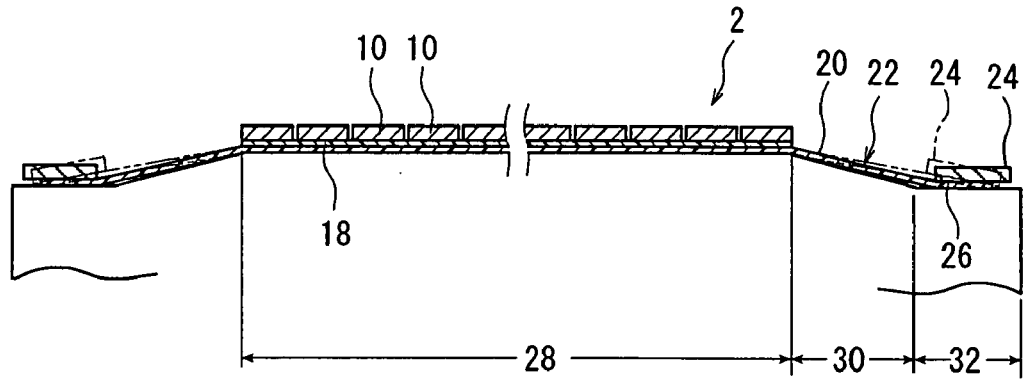
FIG. 7 is a sectional view for illustrating a spacing increasing step.
Figure 8:
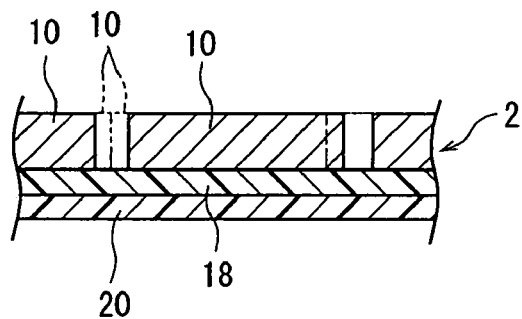
FIG. 8 is an enlarged partial sectional view showing a part of FIG. 7 in an enlarged manner.

Subsequently to the protective film peeling step, a spacing increasing step is performed. FIG. 7 shows a preferred embodiment of the spacing increasing step. In the illustrated embodiment, the wafer 2 having the assembly 22 stuck to the back 16 thereof is placed on a table 26, with the upper surface of the wafer 2 being pointed upward. The table 26 has a central portion 28, an intermediate portion 30, and a peripheral edge portion 32. The upper surface of the central portion 28 of a circular shape is horizontal. The upper surface of the intermediate portion 30 is of a truncated conical shape extending from the peripheral edge of the upper surface of the central portion 28 outwardly in the radial direction in a downwardly inclined manner. The upper surface of the peripheral edge portion 32 is an annular horizontal surface extending horizontally from the lower edge of the upper surface of the intermediate portion 30 in a radially outward direction. The outer diameter of the central portion 28 corresponds to the outer diameter of the wafer 2, and the inner diameter of the peripheral edge portion 32 corresponds to the inner diameter of the ring frame 24. The wafer 2 is located on the central portion 28 of the table 26, and the ring frame 24 is located on the peripheral edge portion 32. At a time when the wafer 2 having the assembly 22 stuck to the back 16 thereof is placed on the table 26, the inner peripheral edge of the ring frame 24 is located somewhat radially inwardly of the inner peripheral edge of the peripheral edge portion 32 of the table 26, and the ring frame 24 is inclined somewhat upwardly in a radially inward direction, as indicated by dashed double-dotted lines in FIG. 7. The ring frame 24 is pressed by a suitable pressing tool (not shown), whereby the whole of the ring frame 24 is moved somewhat radially outwardly, and a radially inner portion of the ring frame 24 is moved downward. By this action, the ring frame 24 is changed from the state indicated by the dashed double-dotted lines to a state indicated by solid lines, namely, a state in which the ring frame 24 extends horizontally along the upper surface of the peripheral edge portion 32 of the table 26. By so doing, the holding film 20 is pulled radially and somewhat stretched and, in accordance with this action, the die bonding film 18 is also somewhat stretched radially. Accordingly, the many rectangular regions 10 present on the die bonding film 18 are radially moved to some extent, whereby the interrelation between the adjacent rectangular regions 10 is changed from a state indicated by dashed double-dotted lines to a state indicated by solid lines in FIG. 8. Consequently, the clearance between the rectangular regions 10 is somewhat increased from the dimension corresponding to the width of the groove 12.

Figure 9:
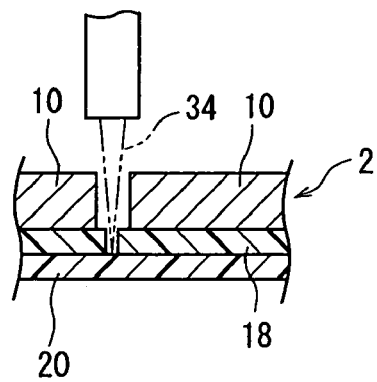
FIG. 9 is an enlarged partial sectional view for illustrating a die bonding film cutting step.

After the spacing increasing step, a die bonding film cutting step is performed. In the die bonding film cutting step, as shown in FIG. 9, a laser beam 34 is thrown, from above the face 6 of the wafer 2, onto the die bonding film 18 through the increased clearance between the rectangular regions 10, and is scanned along the clearance, whereby the die bonding film 18 is cut along the clearance between the rectangular regions 10. Since the laser beam 34 is thrown onto the die bonding film 18 through the increased clearance, the surface of the rectangular region 10 is not irradiated with the laser beam, and only the die bonding film 18 can be irradiated with the laser beam 34 sufficiently easily. As the laser beam 34, there can be used an YAG laser beam or an YVO4 laser beam having a wavelength of 355 nm. The holding film 20 is not cut, but continues to be maintained, so that each of the rectangular regions 10 having the cut die bonding film 18 stuck to the back thereof continues to be held integrally.

Subsequently to the die bonding film cutting step, a pickup step is performed. In this pickup step, the following operation, for example, is performed: A pickup needle (not shown) is caused to act on each of the rectangular regions 10 through the holding film 20 and the die bonding film 18 to raise each of the rectangular regions 10 sequentially, thereby peeling from the holding film 20 each rectangular region 10 having the die bonding film 18 stuck to the back thereof in order to pick it up. On this occasion, the holding film 20 may be irradiated with ultraviolet radiation, as required, whereby the strength of the adhesion between the holding film 20 and the die bonding film 18 can be decreased. Since such a pickup step is itself well known among persons skilled in the art, its detailed explanation is omitted.

While the preferred embodiments of the semiconductor chip manufacturing method constituted according to the present invention have been described in detail by reference to the accompanying drawings, it is to be understood that the invention is not limited to such embodiments, but various changes and modifications may be made without departing from the scope of the invention.

What I claim is:

1. A method for producing a semiconductor chip, adapted to produce many semiconductor chips, each of which has a semiconductor circuit disposed on a face thereof and a die bonding film stuck to a back thereof, from a semiconductor wafer in which many rectangular regions are defined on a face of the semiconductor wafer by streets arranged in a lattice pattern, and the semiconductor circuit is disposed in each of the rectangular regions, the method comprising:

a groove formation step of cutting the face of the semiconductor wafer along the streets to form grooves of a predetermined depth along the streets;

a protective film sticking step of sticking a protective film to the face of the semiconductor wafer, where the grooves have been formed, after the groove formation step;

a division step of grinding a back of the semiconductor wafer after the protective film sticking step to render a thickness of the semiconductor wafer equal to or smaller than a depth of the groove, thereby dividing the rectangular regions individually;

a die bonding film/holding film sticking step of sticking a die bonding film and a holding film, in this order, to the ground back of the semiconductor wafer after the division step, the holding film larger than the semiconductor wafer being used so that the holding film stuck extends out beyond a peripheral edge of the semiconductor wafer;

a protective film peeling step of peeling the protective film from the face of the semiconductor wafer after the die bonding film/holding film sticking step;

a spacing increasing step of stretching the holding film after the protective film peeling step to increase spacing between the individually divided rectangular regions;

a die bonding film cutting step of irradiating the die bonding film with a laser beam from a face side of the semiconductor wafer through a clearance between the rectangular regions after the spacing increasing step to cut the die bonding film along the clearance between the rectangular regions; and a pickup step of picking up each of the rectangular regions, each of which has the semiconductor circuit formed on a face thereof and the die bonding film stuck to a back thereof, from the holding film after the die bonding film cutting step, wherein a ring frame having a larger inner diameter than an outer diameter of the semiconductor wafer is secured to a peripheral edge portion of one surface of the holding film and, wherein, in the spacing increasing step, the ring frame is relatively moved downwardly with respect to the semiconductor wafer located on a table, such that the holding film and the die bonding film are stretched radially.

2. The method for producing a semiconductor chip according to claim 1, wherein in the die bonding film/holding film sticking step, an assembly having the ring frame secured to the peripheral edge portion of the one surface of the holding film and having the die bonding film stuck to a central portion of the one surface or another surface of the holding film is used, and an exposed surface of the die bonding film of the assembly is stuck to the back of the semiconductor wafer.

* * * * *